United States Patent
Fitch et al.

(10) Patent No.: US 6,317,321 B1
(45) Date of Patent: *Nov. 13, 2001

(54) LAP-TOP ENCLOSURE HAVING SURFACE COATED WITH HEAT-ABSORBING PHASE-CHANGE MATERIAL

(75) Inventors: John Stuart Fitch; William Riis Hamburgen, both of Santa Clara, CA (US)

(73) Assignee: Compaq Computer Corporation, Houston, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/868,587

(22) Filed: Jun. 4, 1997

Related U.S. Application Data

(62) Division of application No. 08/334,840, filed on Nov. 4, 1994, now abandoned.

(51) Int. Cl.[7] .................................................. H05K 7/20
(52) U.S. Cl. .................... 361/700; 174/15.2; 165/104.33
(58) Field of Search ............................... 165/10, 104.33, 165/104.19; 174/15.2; 361/700, 704–705, 708–709, 687

(56) References Cited

U.S. PATENT DOCUMENTS

| | | | |
|---|---|---|---|
| 4,047,198 | * | 9/1977 | Sekhon et al. ................... 361/709 |
| 4,727,455 | * | 2/1988 | Neidis et al. ..................... 361/700 |
| 4,912,548 | * | 3/1990 | Shanker et al. ................ 165/104.33 |
| 5,007,478 | * | 4/1991 | Sengupta ........................... 361/700 |
| 5,046,365 | * | 9/1991 | Kumley et al. .................... 361/700 |
| 5,224,356 | * | 7/1993 | Colvin et al. ...................... 361/700 |
| 5,349,237 | * | 9/1994 | Saytra et al. ...................... 174/15.2 |
| 5,455,458 | * | 10/1995 | Quon et al. ........................ 361/708 |

FOREIGN PATENT DOCUMENTS

| | | | |
|---|---|---|---|
| 5341874 | * | 12/1993 | (JP) ..................................... 361/687 |
| 4083395 | * | 3/1992 | (JP) ..................................... 361/700 |

OTHER PUBLICATIONS

IBM Tech Disclosure Bulletin, "Substrate Mounted Heat Pipe for Chip Cooling", Bettelaar et al, vol. 14, No. 9, Feb. 1972, 361/715 p. 269.*

* cited by examiner

*Primary Examiner*—Gregory Thompson
(74) *Attorney, Agent, or Firm*—Hamilton, Brook, Smith & Reynolds, P.C.

(57) ABSTRACT

An electronic apparatus, e.g., a lap top computer, has an enclosure which on its inner surface is coated with a phase-change material, e.g., in micro encapsulated form, preferably mixed with paint which is used to coat the inner surface of the enclosure. The phase change material absorbs heat generated by components in the electronic apparatus and maintains the components in the apparatus at a reasonable temperature.

6 Claims, 3 Drawing Sheets

LAP-TOP ENCLOSURE HAVING SURFACE COATED WITH HEAT-ABSORBING PHASE-CHANGE MATERIAL

This application is a division of application Ser. No. 08/334,840, filed Nov. 4, 1994, now abandoned.

FIELD OF THE INVENTION

The present invention relates to the thermal management of packaged semiconductor chips, and, in particular, is directed to thermal management accomplished by incorporating phase change materials within and/or around semiconductor chip electronic packages.

BACKGROUND OF THE INVENTION

Packaging is one of the final steps in the process of manufacturing semiconductor chips. In packaging, a fabricated semiconductor chip is mounted within a protective housing. At the present moment, the art of semiconductor chip technology has evolved far more rapidly than the integrally related technology of packaging the semiconductor chips. The packaging requirements of the newer, smaller, more powerful semiconductor chips are quickly progressing beyond the capabilities of traditional packaging technology and the conventional materials and designs presently utilized are fast becoming obsolete. The packaging demands of new semiconductors require configurations to accommodate increasing numbers of electrical interconnections, space constraints due to decreasing system size, reduction in costs, improved reliability, and increasing heat transfer capabilities.

The need to adequately transfer heat out of increasingly smaller semiconductor packages and more compact housing arrangements has spawned significant interest in the development of new packaging materials and more thermally efficient configurations. Currently, semiconductor packaging commonly utilizes the art of attaching an external heatsink to improve the heat transfer characteristics of many chip packages which, by themselves, do not adequately transfer heat away from the semiconductor chip. However, with decreasing size, increasing heat concentration and high density packaging of new semiconductor chips the standard addition of an external heatsink often is no longer practical, sufficiently thermally efficient or effective.

A significant limitation on the operation and reliability of semiconductor chip packages is the efficient and effective extraction of heat. It is desirable to provide the chip packages with heat transfer mechanism to maintain them within a predetermined safe operating temperature range.

SUMMARY OF THE INVENTION

According to the present invention, an improved electronic package has been developed in which phase change material is incorporated inside and/or around the package. By including an effective amount of a phase change material with a package, an electronic device is enabled to operate at a nearly constant temperature. Accordingly, for devices which operate for a predictable length of time, an effective amount of phase change material to be incorporated can be calculated, such that use of an external heatsink attachment may be eliminated, or relegated to back-up utility.

Phase change materials are materials which, when heated, undergo isothermal changes in physical state, e.g., from a solid into a liquid, from a liquid to a gas, or from one solid phase to another solid phase. Subsequent removal of heat from the liquid or gas phase returns the material back to its solid or liquid phase. In application within an electronic package, as heat is generated by an operating device within the package, the incorporated phase change material, in effect, absorbs the generated heat, using the heat to isothermally convert from one phase to another. The phase change material is maintained at a constant temperature, and, in turn, the electronic device is able to "dump" its heat to effect the phase change and also maintain itself at a constant temperature. No additional heatsink or heat dissipation attachment is required as long as sufficient phase change material is present to absorb the heat generated during a finite, predictable electronic device operational period. Once all of the phase change material has been converted to its next phase through absorption of heat, a continued flow of heat energy from the electronic device would then cause the temperature of the phase change material to rise, and the effectiveness as an isothermal heat absorber becomes exhausted.

When the electronic device is not in operation, heat, in turn, no longer is generated, and, the device, the package, and the incorporated phase change material are allowed to cool. As they cool, the phase change material gives off heat to the surrounding environment and returns to its original state as a solid or liquid. The material then is ready to once again serve to absorb heat from the electronic device during the next operational period. In practice, heating and cooling may actually occur simultaneously, with the lower phase solid or liquid always being present as the case may be.

The desired operating temperature of a semiconductor chip generally ranges from about 50 to about 80° C. Accordingly, it is preferred to select and utilize a phase change material whose phase changing temperature is in that same temperature range. Some liquid phase change materials, such as certain alcohols, change to vapor phase at or about 70° C.; but, the volume of the material expands extremely when the phase changes from liquid to vapor, and, this volume increase presents considerable containment issues. Accordingly, solid to liquid phase change materials are preferred, since their expansions are significantly smaller. Several such materials have been suggested in the prior art, including waxes, metals (such as gallium, cesium, rubidium, and the like), and alloys (such as Bi/Pb/Sn/In, and the like).

Preferably, according to the present invention, phase change material is encapsulated, such that it readily can be incorporated into semiconductor chip electronic package assemblies. Encapsulation accommodates introduction of the phase change material into close proximity of the electronics within and/or around the package and/or enclosed semiconductor chip by integrating it within the package design itself, without concern regarding contamination, containment, or degradation.

In a preferred embodiment, phase change material is encapsulated, using conventional, commercially available microencapulation techniques, to produce pellets or microspheres of encapsulated phase change materials. Typically, the material may be encapsulated with impermeable, structurally sound material, such as shellac or gelation, to produce micropheres ranging in diameter from about five to about five thousand microns, having shells about one micron thick.

The encapsulated phase change material readily can be incorporated into or added to conventional electronic package assemblies. For example, injection molding plastic compositions could be modified by adding microspheres containing phase change material to the standard blend.

Encapsulated phase change material also could be applied to selected surfaces by loading paints with phase change microspheres. The phase change materials mixed with epoxies, pyralene, silicones, and the like further could be strategically applied or added to an electronic package.

The use of phase change materials as disclosed could prove to be very useful to control the operating temperature of electronics at a constant or low value. This is particularly advantageous for low voltage electronics designs, currently emerging in the electronics industry, which are very sensitive to temperature variations. Phase change materials further may be very appropriate in the area of portable electronics, where weight, size, cost, or complexity of a heatsink or fan may be considered onerous. Phase change materials accommodate long, cool operation of an integrated chip, without the need for a heatsink element.

BRIEF DESCRIPTION OF THE DRAWINGS

For a further understanding of the nature of the present invention, as well as other features and advantages thereof, references should be made to the following detailed description taken in conjunction with the accompanying drawings wherein.

DETAILED DESCRIPTION OF PREFERRED EMBODIMENTS

Figure 1:
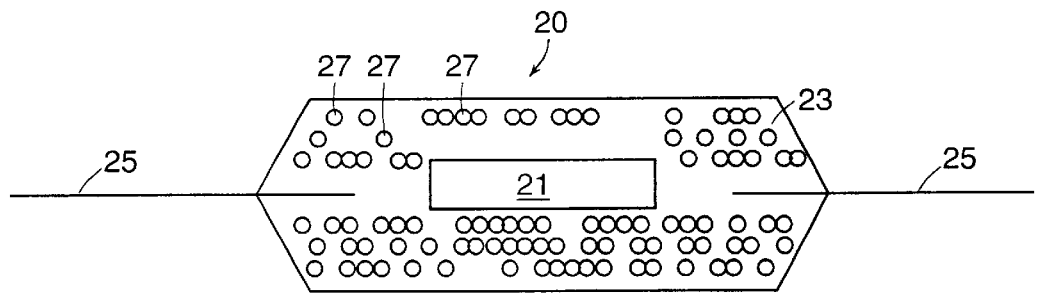
FIG. 1 is a cross-sectional view depicting one embodiment of the invention wherein microspheres of encapsulated phase change material are included in the molding composition of a conventional transfer molded package.

Referring to FIG. 1, a molded, plastic package 20 is shown with semiconductor chip 21 encased within plastic molded body 23 and attached to leadframe 25 by bondwires (not shown). Embedded within the molded plastic are microspheres 27 of phase change material. Standard manufacturing processes could be used to produce the package; encapsulated phase change material simply is blended in with conventional plastic molding composition.

Figure 2:
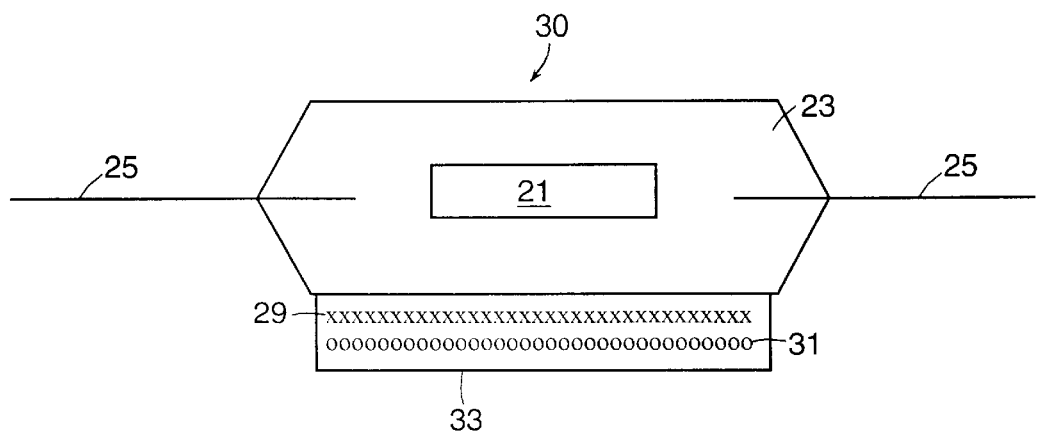
FIG. 2 is a cross sectional view depicting an embodiment wherein two phase change materials are layered and encapsulated on the surface of a standard package.

FIG. 2 depicts an embodiment wherein one or more layers of phase change material are applied to the external surface of molded plastic package 30. As shown, a first layer of a low melting phase change material 29 is coating immediately adjacent to the package surface, and a higher temperature melting phase change material 31 is applied over the first. The first layer, which would initiallly cool the package, would change into liquid phase at a relatively low temperature and then serve as a heat transfer connection to the higher heat of fusion material.

The phase change material could be applied as a layer which is subsequently sealed with encapsulant coating 33, or it may be applied within a self-sealing medium, such-as a paint or epoxy.

Figure 3:
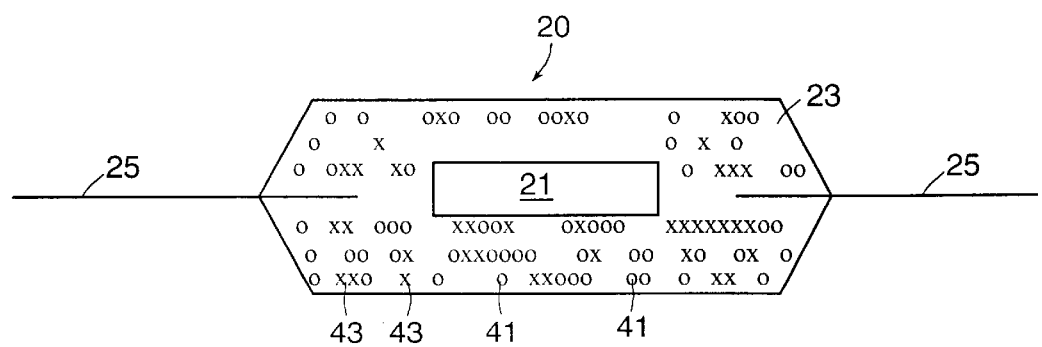
FIG. 3 is a cross sectional view depicting an embodiment wherein a heterogeneous mixture of phase change materials is embedded within a molded electronic package.

In FIG. 3, a molded plastic package 20 is illustrated wherein, in a fashion similar to that of FIG. 1, microencapsulated phase change material is embedded with the plastic composition of the molded body 23. However, in this embodiment, a heterogeneous mixture of phase change materials 41 and 43 is used.

By using heterogeneous or layered methods of applying phase change materials, different operating temperatures or cooling schemes readily may be engineered. For example, both high and low temperature phase change material could be included in a package assembly. When the first low temperature material entirely changes phase and the system temperature begins to rise to the melting temperature of the second, high temperature phase change material, temperature sensors built into the chip could be arranged to detect the temperature rise and warn the user that the cooling capacity was about to be exhausted, and the electronics could be shut down. This feature might also be associated with battery life, such that the heat capacity of the phase change material was designed to last as long as the battery.

Figure 4:
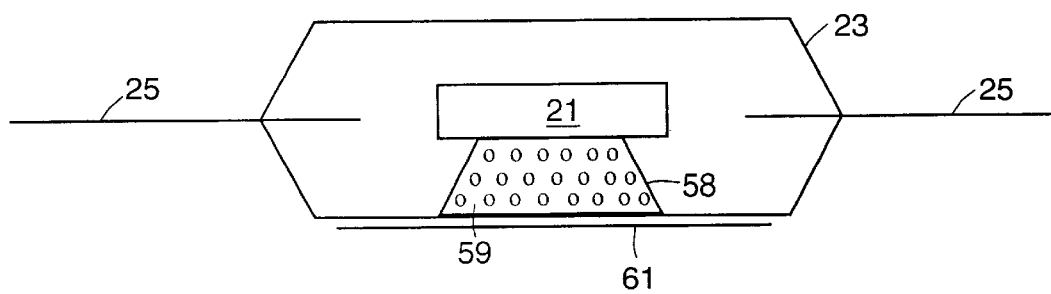
FIGS. 4, 5, and 6 show cross-sectional views of embodiments wherein slugs of phase change loaded material are added onto a package.
Figure 5:
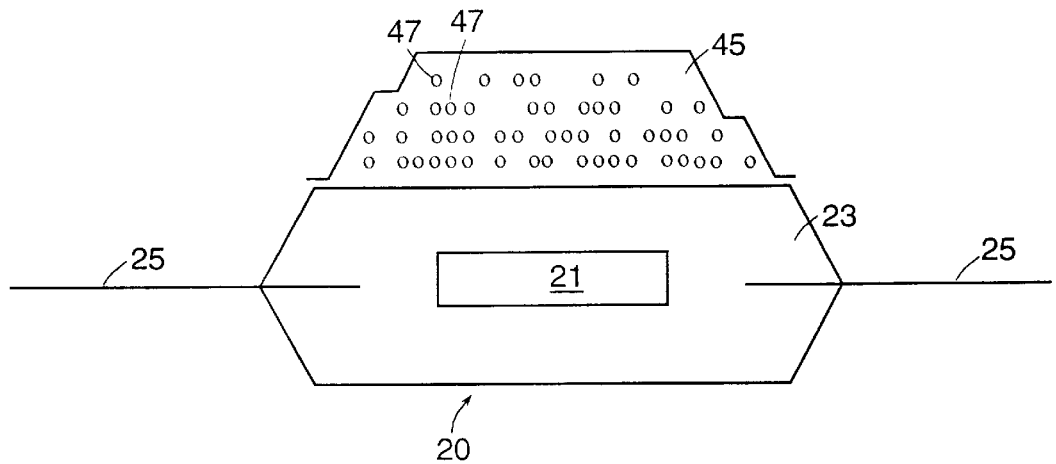
Figure 6:
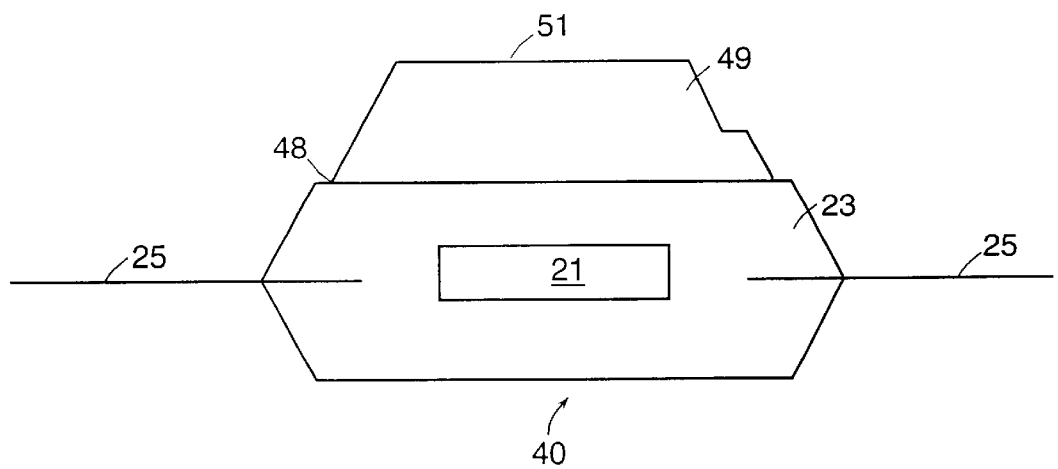

As illustrated in FIGS. 4, 5, and 6, instead of modifying the molding composition and incorporating phase change material into the body of the electronic package itself, a "slug" of phase change material simply may be applied to the outside of a standard package or used to fill an existing cavity in the package. Using package molds that leave a recess or well 58 near the backside of the enclosed semiconductor chip (often to accommodate heatsink attachment), phase change material 59 instead could be employed to fill the well 58. An encapsulant or a mechanical lid 61 then could be applied to enclose the phase change material 59.

In FIG. 5, a glob of material 45 such as epoxy, pyralene, silicone, or the like, loaded with microencapsulated phase change material 47 is set on top of a conventional package 20.

As shown in FIG. 6, the phase change material 49 may be added to the package and then encapsulated by a covering 51 of epoxy, silicone, and the like, or a mechanical enclosure. The covering or enclosure makes a seal to the package 40 at its juncture 48. Various shapes, thicknesses, layers may be used, and the package may be coated on multiple sides. The phase change material 49 may be fashioned into the shape of a heatsink, so that it may be cooled more effectively. To effect this configuration, the phase change material may be blended with epoxy, or a suitable binder, and fashioned into the desired shape; or, geometrical integrity may be provided by covering or mechanical enclosure 51.

Employment of the phase change material serves to provide thermal management; however, use of the material does not preclude the additional use of a conventional heatsink attachment, as well, for long term, steady state cooling applications, if desired.

Figure 7:
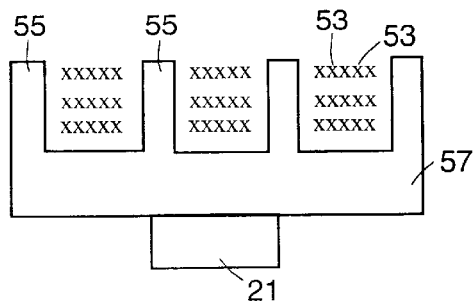
FIG. 7 is a simplified, cross-sectional view showing a semiconductor chip or package to which a heatsink member has been attached, wherein the fins of the heatsink are structured to accomodate phase change material.

A further embodiment, taking advantage of both a mechanical heatsink attachment, as well as, phase change material is shown in FIG. 7. Here, phase change material 53 is incorporated amidst the heatsink fins 55 of a typical heatsink element 57. In this fashion, the temperature of the heatsink, and in turn the electronic device, might remain nearly constant for an extended period of time. An additional feature is that the fins of the heatsink serve as a highly efficient means of spreading the heat into the phase change material, since the fins actually penetrate into the material.

Figure 8:
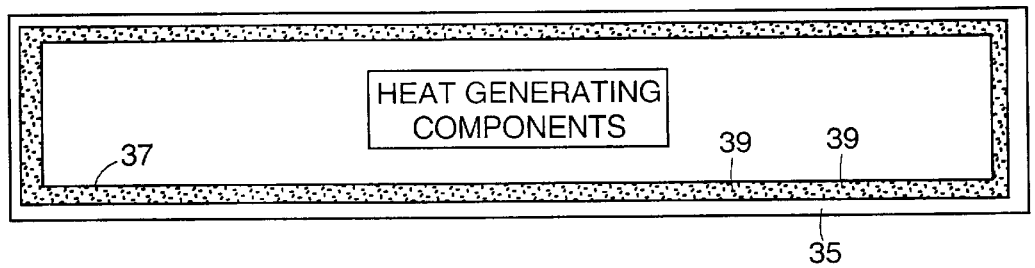
FIG. 8 is a simplified side-view cross-sectional representation of an embodiment wherein phase change material is employed in cooling the surface of a standard "lap top" enclosure.

Surfaces may be coated with phase change materials, followed by encapsulating sealing coats; or, paints loaded with encapsulated phase change materials may be utilized. One such application, illustrated in FIG. 8, shows an electronic apparatus enclosure, e.g., a "lap top" enclosure 35 in part which has been coated on the inside surface with a layer of paint 37 loaded with phase change microencapsulants 39.

While the invention has been described with reference to specific embodiments thereof, it is intended that all matter contained in the above description or shown in the accompanying drawings be interpreted as illustrative and not limiting in nature. Various modifications of the disclosed embodiments, as well as other embodiments of the invention, will be apparent to those skilled in the art upon reference to this description, or may be made without departing from the spirit and scope of the invention defined in the appended claims.

We claim:

1. A lap-top computer enclosure having heat generating electronic components enclosed in the lap-top computer enclosure, the lap-top computer enclosure having an inner surface coated with an encapsulant layer containing phase-change material which absorbs heat produced by the heat generating electronic components such that heat is dissapated from the components in an isothermal process.

2. The lap-top computer enclosure of claim 1 wherein the phase-change material is in a micro-encapsulated form loaded into a layer of paint coating the inner surface of the enclosure, the electronic components being spatially separated from the layer of paint and the enclosure.

3. A method of thermal management of an electronic apparatus which includes heat generating components which are enclosed in an enclosure, comprising the step of:

applying a coated layer of a phase change material to an inner surface of said enclosure, which phase change material after absorbing heat from the heat generating components assists in maintaining a normal operating temperature of the apparatus.

4. A lap-top computer enclosure for enclosing heat generating electronic components, the lap-top computer enclosure having an inner surface coated with a layer of paint loaded with phase-change micro-encapsulants which absorb heat produced by the heat generating electronic components such that heat is dissapated from the components in an isothermal process, the electronic components being spatially separated from the layer of paint and the enclosure.

5. An enclosure for enclosing heat generating components, comprising:

an inner surface; and a layer forming a thin coating on the inner surface, the layer being formed of a plurality of phase-change microencapsulants which absorbs heat produced by the heat generating electronic components such that heat is dissipated from the components in an isothermal process.

6. The enclosure of claim 5 wherein the layer is formed of paint loaded with the phase-change material in microencapsulated form, the paint coating the inner surface, and the electronic components being spatially separated from the layer of paint and the enclosure.

\* \* \* \* \*

UNITED STATES PATENT AND TRADEMARK OFFICE
CERTIFICATE OF CORRECTION

PATENT NO. : 6,317,321 B1
DATED : November 13, 2001
INVENTOR(S) : John Stuart Fitch and William Riis Hamburgen It is certified that error appears in the above-identified patent and that said Letters Patent is hereby corrected as shown below:

<u>Column 5, lines 31-33, through Column 16, lines 1-5 ,</u>
Claim 3 is an extra claim. Please remove and renumber remaining claims.

Signed and Sealed this

Thirtieth Day of April, 2002

*Attest:*

*Attesting Officer*

JAMES E. ROGAN
*Director of the United States Patent and Trademark Office*